(12) United States Patent
Lee et al.

(10) Patent No.: US 11,442,356 B2
(45) Date of Patent: Sep. 13, 2022

(54) LITHOGRAPHY MASK WITH AN AMORPHOUS CAPPING LAYER

(71) Applicant: Taiwan Semiconductor Manufacturing Co., Ltd., Hsin-Chu (TW)

(72) Inventors: Hsin-Chang Lee, Hsinchu County (TW); Pei-Cheng Hsu, Taipei (TW); Chih-Tao Chien, Hsinchu (TW); Ming-Wei Chen, Hsinchu (TW); Ta-Cheng Lien, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 173 days.

(21) Appl. No.: 16/872,212

(22) Filed: May 11, 2020

(65) Prior Publication Data
US 2021/0349386 A1 Nov. 11, 2021

(51) Int. Cl.
*G03F 1/24* (2012.01)
*G03F 1/38* (2012.01)
*G03F 1/48* (2012.01)

(52) U.S. Cl.
CPC .................. *G03F 1/24* (2013.01); *G03F 1/38* (2013.01); *G03F 1/48* (2013.01)

(58) Field of Classification Search
USPC ........................................................... 430/5
See application file for complete search history.

(56) References Cited

U.S. PATENT DOCUMENTS

| | | |
|---|---|---|
| 8,796,666 B1 | 8/2014 | Huang et al. |
| 8,841,047 B2 | 9/2014 | Yu et al. |
| 8,877,409 B2 | 11/2014 | Hsu et al. |
| 9,093,530 B2 | 4/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,869,934 B2 | 1/2018 | Huang et al. |
| 9,869,939 B2 | 1/2018 | Yu et al. |
| 2008/0318140 A1 | 12/2008 | Hayashi et al. |
| 2015/0010854 A1 | 1/2015 | Seo et al. |
| 2016/0109792 A1 | 4/2016 | Mikami |
| 2018/0373138 A1 | 12/2018 | Yu et al. |
| 2021/0063865 A1* | 3/2021 | Lin .......................... G03F 1/24 |

FOREIGN PATENT DOCUMENTS

| | | |
|---|---|---|
| JP | 2016519329 | 6/2016 |
| KR | 2009001664 A | 2/2009 |
| TW | 202028495 A | 8/2020 |
| WO | WO2007142365 | 12/2007 |
| WO | WO2014165298 | 10/2014 |

\* cited by examiner

*Primary Examiner* — Christopher G Young
(74) *Attorney, Agent, or Firm* — Haynes and Boone, LLP

(57) ABSTRACT

A multi-layer reflective structure is disposed over the substrate. An amorphous capping layer is disposed over the multi-layer reflective structure. The amorphous capping layer may contain ruthenium, oxygen, niobium, nitrogen, tantalum, or zirconium. An amorphous layer may also be disposed between the multi-layer reflective structure and the amorphous capping layer. The amorphous layer includes amorphous silicon, amorphous silicon oxide, or amorphous silicon nitride.

20 Claims, 15 Drawing Sheets

LITHOGRAPHY MASK WITH AN AMORPHOUS CAPPING LAYER

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As the semiconductor device sizes continue to shrink, for example below 20 nanometer (nm) nodes, traditional lithography technologies have optical restrictions, which leads to resolution issues and may not achieve the desired lithography performance. In comparison, extreme ultraviolet (EUV) lithography can achieve much smaller device sizes. However, existing EUV lithography may still face certain challenges. For example, the capping layer of existing EUV masks may become easily damaged, which may degrade lithography performance and/or shorten the lifespan of the EUV mask.

Therefore, while existing EUV lithography systems and methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
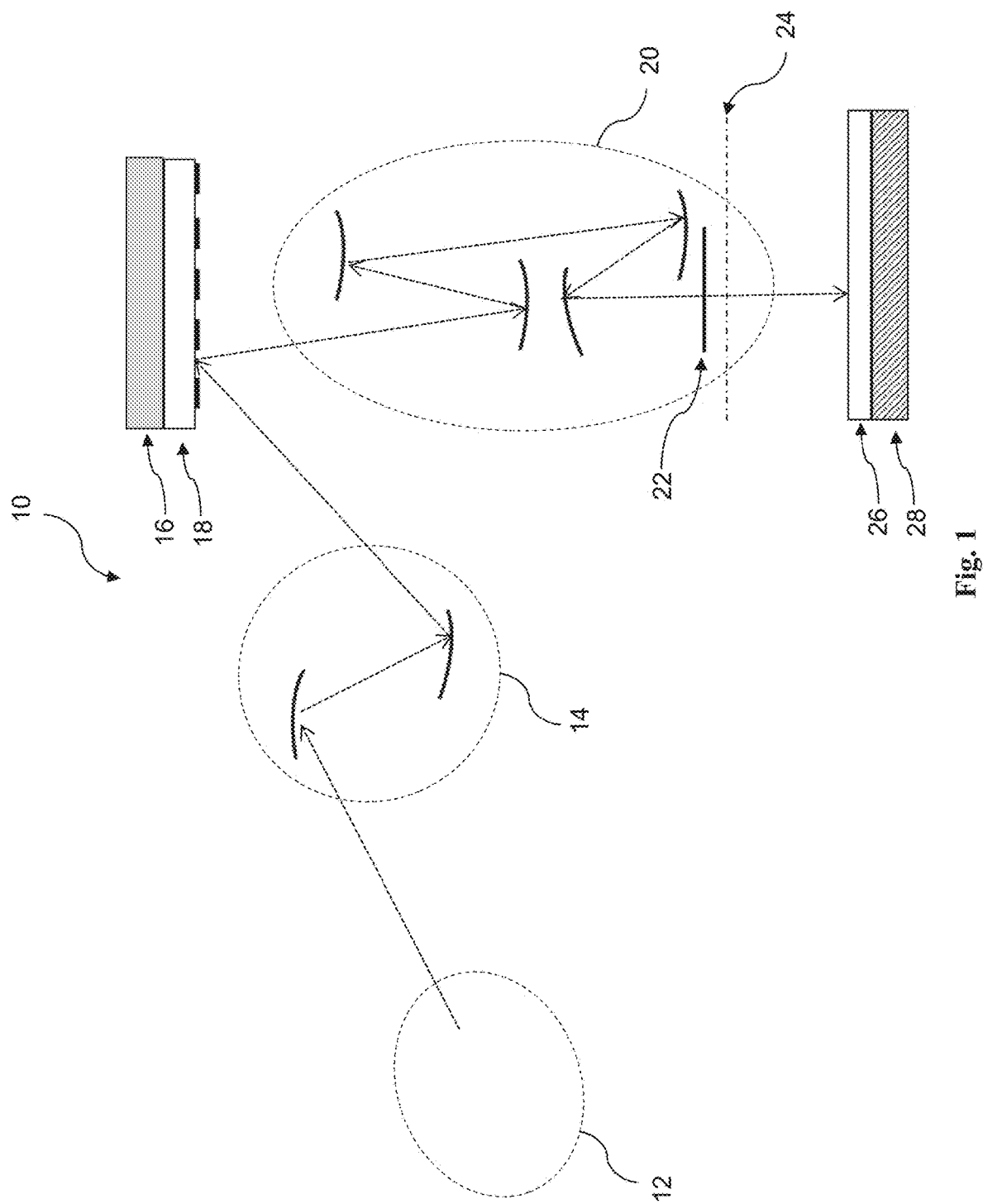
FIG. 1 is a schematic view of a lithography system constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Extreme ultraviolet (EUV) lithography has become widely used due to its ability to achieve small semiconductor device sizes. However, conventional systems and methods of performing EUV lithography may still face various challenges. For example, conventional EUV systems employ a lithography mask configured to perform EUV lithography. Among other components, the EUV lithography mask includes a capping layer that is configured to protect some of the other components (e.g., a multi-layer reflective structure) of the EUV lithography mask. Conventional EUV lithography masks may implement the capping layer using a poly-crystalline material. Unfortunately, such a poly-crystalline material may become easily damaged during the various EUV lithography processes.

For example, a material with a poly-crystalline structure has multiple crystallites (also referred to as "grains") of varying sizes and orientations. A grain boundary may refer to an interface between two of such grains or crystallites. During lithography processes, for example during dry etching and cleaning (or as a result thereof), the grain boundaries of the poly-crystalline capping layer may become cracked or otherwise roughened (as opposed to having a smooth flat surface). These damages to the capping layer may adversely impact the lithography performance, for example with respect to the critical dimension (CD) during wafer printing. The damages to the capping layer may also shorten a lifespan of the EUV lithography mask, since the EUV lithography masks with capping layer damages are less able to withstand particle removal by cleaning or e-beam repair. If EUV lithography masks have to be frequently replaced due to excessive damage, that may increase the cost of semiconductor fabrication.

To alleviate these problems discussed above, the present disclosure forms an EUV lithography mask having a capping layer with an amorphous structure, rather than a poly-crystalline structure. The amorphous structure allows the capping layer to better withstand the various EUV lithography processes without becoming damaged, thereby improving EUV lithography performance and prolonging the lifespan of the EUV lithography mask. The various aspects of the present disclosure will be discussed below in greater detail with reference to FIGS. 1-15. First, a EUV lithography system according to embodiments of the present disclosure is discussed below with reference to FIG. 1. Next, the details of an EUV mask that is a part of the EUV lithography system according to embodiments of the present disclosure are discussed with reference to FIGS. 2-15.

FIG. 1 is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates a EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a EUV lithography mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the EUV lithography mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the EUV lithography mask 18. In an example, a disk illuminator 14 with partial coherence σ being at most 0.3 is employed. In some other embodiments, the illuminator 14 is configured to provide an off-axis illumination (OAI) to the EUV lithography mask 18. In an example, the illuminator 14 is a dipole illuminator. The dipole illuminator has a partial coherence σ of at most 0.3 in some embodiments.

The lithography system 10 also includes a mask stage 16 configured to secure a EUV lithography mask 18. In some embodiments, the mask stage 16 includes an electrostatic chuck (e-chuck) to secure the EUV lithography mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is a EUV lithography system, and the EUV lithography mask 18 is a reflective mask. One exemplary structure of the EUV lithography mask 18 is provided for illustration. The EUV lithography mask 18 includes a substrate with a suitable material, such as a low thermal expansion material (LTEM) or fused quartz. In various examples, the LTEM includes $TiO_2$ doped $SiO_2$, or other suitable materials with low thermal expansion. In some embodiments, the LTEM includes 5%-20% by weight $TiO_2$ and has a thermal coefficient of expansion lower than about $1.0 \times 10^{-6}/°$ C. For example, in some embodiments, the $TiO_2$ doped $SiO_2$ material of the LTEM has a coefficient thermal expansion such that it varies by less than 60 parts-per-billion for every 1 degree Celsius of temperature change. Of course, other suitable materials having thermal coefficient of expansion that is equal to or less than $TiO_2$ doped $SiO_2$ may also be used.

The EUV lithography mask 18 also includes a multi-layer reflective structure deposited on the substrate. The multi-layer reflective structure includes a plurality of film pairs, such as molybdenum-silicon (Mo/Si) film pairs (e.g., a layer of molybdenum above or below a layer of silicon in each film pair). Alternatively, the multi-layer reflective structure may include molybdenum-beryllium (Mo/Be) film pairs, or other suitable materials that are configurable to highly reflect the EUV light.

The EUV lithography mask 18 may further include a capping layer that is disposed on the multi-layer reflective structure for protection of the multi-layer reflective structure and/or the layers therebelow. Conventional EUV masks may implement a capping layer having a poly-crystalline structure. As discussed above, the poly-crystalline structure for capping layers may be prone to damage, for example the grain boundaries of the poly-crystalline capping layer may become roughened or cracked as a result of lithography processes such as etching and cleaning. The damages to the poly-crystalline capping layer may cause problems in fabrication such as worse critical dimension (CD). The EUV lithography mask itself may also suffer from a reduced lifespan due to the damages to the poly-crystalline capping layer.

According to embodiments of the present disclosure, the capping layer of the EUV lithography mask 18 has an amorphous structure, rather than a poly-crystalline structure. In that regard, amorphous structures are non-crystalline and may lack a well-defined geometric shape, since their constituents are not arranged in an ordered manner. As such, amorphous structures may not have the grain boundaries that exist for poly-crystalline structures. Since fabrication-induced damages typically occur at the grain boundaries, the lack of grain boundaries of the amorphous capping layer substantially prevents or at least reduces the damages that could occur thereon. Consequently, lithography performance may be improved, and the lifespan of the EUV lithography mask 18 may be prolonged, which reduces cost of semiconductor fabrication.

In some embodiments, the amorphous capping layer includes an amorphous ruthenium (Ru) material. In some embodiments, the amorphous capping layer may further include one or more of the following elements: oxygen, niobium, nitrogen, tantalum, or zirconium. In some embodiments, the amorphous capping layer may be formed by first forming an amorphous layer on the multi-layer reflective structure, and therefore after forming the amorphous capping layer on the amorphous layer. In other embodiments, the amorphous capping layer may be formed by first treating the upper surface of the multi-layer reflective structure (for example by treating it with a plasma), and thereafter forming the amorphous capping layer on the treated surface of the multi-layer reflective structure. The formation of the amorphous capping layer will be discussed in greater detail with reference to FIGS. 2-5.

The EUV lithography mask 18 further includes an absorption layer (also referred to as an absorber layer) deposited over the amorphous capping layer. The absorption layer is patterned to define a layer of an integrated circuit (IC). Alternatively, another reflective layer may be deposited over the multi-layer reflective structure and is patterned to define a layer of an integrated circuit, thereby forming a EUV phase shift mask.

The lithography system 10 also includes a projection optics module (or projection optics box (POB) 20 for imaging the pattern of the EUV lithography mask 18 on to a target 26 (e.g., a semiconductor substrate) secured on a substrate stage 28 of the lithography system 10. The POB 20 has refractive optics (such as for UV lithography system) or alternatively reflective optics (such as for EUV lithography system) in various embodiments. The light directed from the EUV lithography mask 18, diffracted into various diffraction orders and carrying the image of the pattern defined on the mask, is collected by the POB 20. The POB 20 may include a magnification of less than one (thereby the size of the "image" on a target (such as target 26 discussed below) is smaller than the size of the corresponding "object" on the mask). The illuminator 14 and the POB 20 are collectively referred to as an optical module of the lithography system 10.

The lithography system 10 also includes a pupil phase modulator 22 to modulate optical phase of the light directed from the EUV lithography mask 18 so that the light has a phase distribution on a projection pupil plane 24. In the optical module, there is a plane with field distribution corresponding to Fourier Transform of the object (the EUV lithography mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane 24. A pupil filter filters out specific spatial frequency components of the EUV light from the EUV lithography mask 18. Particularly, the pupil filter is a phase pupil filter that functions to modulate phase distribution of the light directed through the POB 20. However, utilizing a phase pupil filter is limited in some lithography system (such as an EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The EUV lithography mask 18 and the method making the same are further described in accordance with some embodiments. In some embodiments, the mask fabrication process includes two operations: a blank mask fabrication process and a mask patterning process. During the blank mask fabrication process, a blank mask is formed by depositing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The EUV lithography mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed, and the incident light is diffracted by a multilayer (multi-layer reflective structure). The PSM can be an attenuated PSM (Attis) or an alternating PSM (AltPSM). An exemplary PSM includes a first reflective layer (such as a reflective multi-layer reflective structure) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
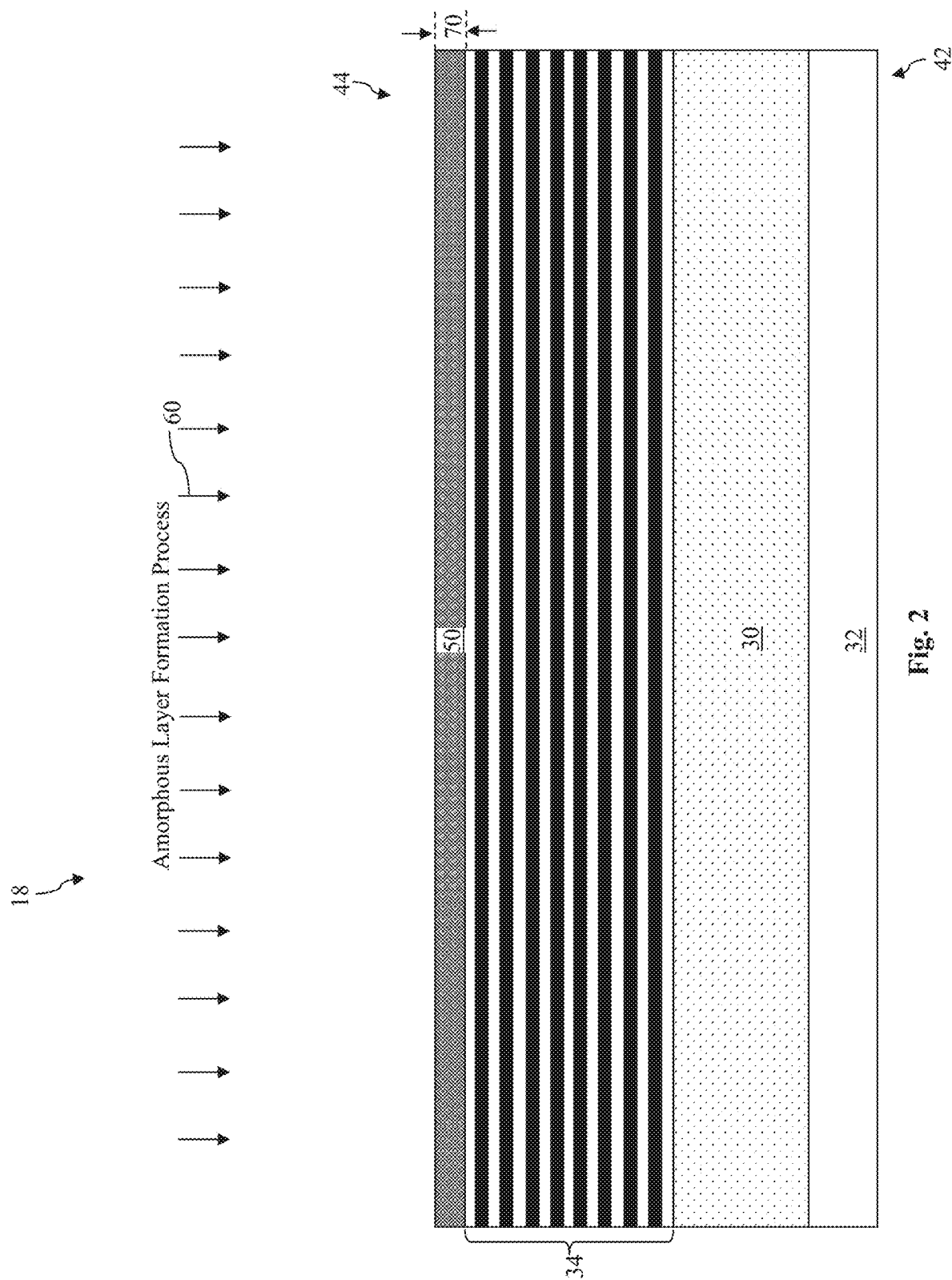
FIGS. 2-13 illustrate cross-sectional views of a lithography mask at various stages of fabrication according to embodiments of the present disclosure.

FIGS. 2-13 are diagrammatic fragmentary cross-sectional side views of a lithography mask at various stages of fabrication according to one embodiment of the present disclosure. Referring to FIG. 2, the EUV lithography mask 18 in FIG. 1 is illustrated in more detail. The EUV lithography mask 18 includes a substrate 30 made of a LTEM. The LTEM may include $TiO_2$ doped $SiO_2$, and/or other low thermal expansion materials known in the art. In some embodiments, a conductive layer 32 is additionally disposed under on a side 42 (also referred to as a backside) of the LTEM substrate 30 for the electrostatic chucking purpose. In one example, the conductive layer 32 includes chromium nitride (CrN). In other embodiments, other suitable compositions are possible, such as a tantalum-containing material.

The EUV lithography mask 18 includes a multi-layer reflective structure 34 disposed over a side 44 (also referred to as a front side) of the LTEM substrate 30. The multi-layer reflective structure 34 may be selected such that it provides a high reflectivity to a selected radiation type/wavelength. The multi-layer reflective structure 34 includes a plurality of film pairs, such as Mo/Si film pairs (e.g., a layer of molybdenum above or below a layer of silicon in each film pair). Alternatively, the multi-layer reflective structure 34 may include Mo/Be film pairs, or any materials with refractive index difference being highly reflective at EUV wavelengths.

Still referring to FIG. 2, an amorphous layer 50 is formed on the upper surface of the uppermost layer of the multi-layer reflective structure 34. The amorphous layer 50 helps the layer to be formed thereon (i.e., the amorphous capping layer) to achieve an amorphous structure. This is because the lattice arrangement (e.g., whether it is a single crystal structure, a poly-crystal structure, or an amorphous structure) of a thin layer (which the capping layer will be) is significantly affected by the lattice arrangement of the layer underneath. In other words, if the layer 50 is formed to have an amorphous structure, the layer to be formed thereon (i.e., the capping layer) is also likely to have an amorphous structure. This may be referred to as "substrate tuning", as the amorphous layer 50 may be considered an "amorphous substrate" for the amorphous capping layer to be formed thereon.

The amorphous layer 50 may be formed using an amorphous layer formation process 60. In some embodiments, the amorphous layer formation process 60 may include an epitaxial growth process. In some other embodiments, the amorphous layer formation process 60 may include a deposition process. The deposition process may include an atomic layer deposition (ALD) process, for example an ALD process that is performed at a low temperature in a range between about 26 degrees Celsius and about 60 degrees Celsius. The deposition process may also include a chemical vapor deposition (CVD) process, for example an atmospheric pressure CVD (APCVD) process, a low pressure CVD (LPCVD) process, a laser-enhanced CVD (LECVD) process, and/or a plasma-enhanced CVD (PECVD) process. The deposition process may also include a physical vapor deposition (PVD) process, for example an electrically heated evaporation (thermal evaporation) process, a pulsed laser deposition process, an electron-beam evaporation process, a molecular beam epitaxy process, an ion beam assisted evaporation process, and/or a discharged based deposition process such as sputtering or arc evaporation.

The amorphous layer 50 is formed to have a thickness 70. The value of the thickness 70 is tunable by adjusting the various parameters of the amorphous layer formation process 60, for example a time duration of deposition, etc. In some embodiments, the thickness 70 is tuned to be in a range between about 0.1 nanometers (nm) and about 4 nm, for example between about 2 nm and about 4 nm. Such a thickness range for the amorphous layer 50 helps ensure that the amorphous layer 50 is sufficiently thick to help the capping layer to be formed thereon to achieve the amorphous structure, but not too thick to significantly affect the reflectivity of the multi-layer reflective structure 34.

In some embodiments, the uppermost layer of the multi-layer reflective structure 34 is a silicon layer, and the amorphous layer 50 is formed directly on the uppermost surface of this uppermost silicon layer of the multi-layer reflective structure 34. In some embodiment, the amorphous layer 50 may include, but are not limited to: amorphous silicon, amorphous silicon oxide ($SiO_2$), or amorphous silicon nitride (SiN).

Figure 3:
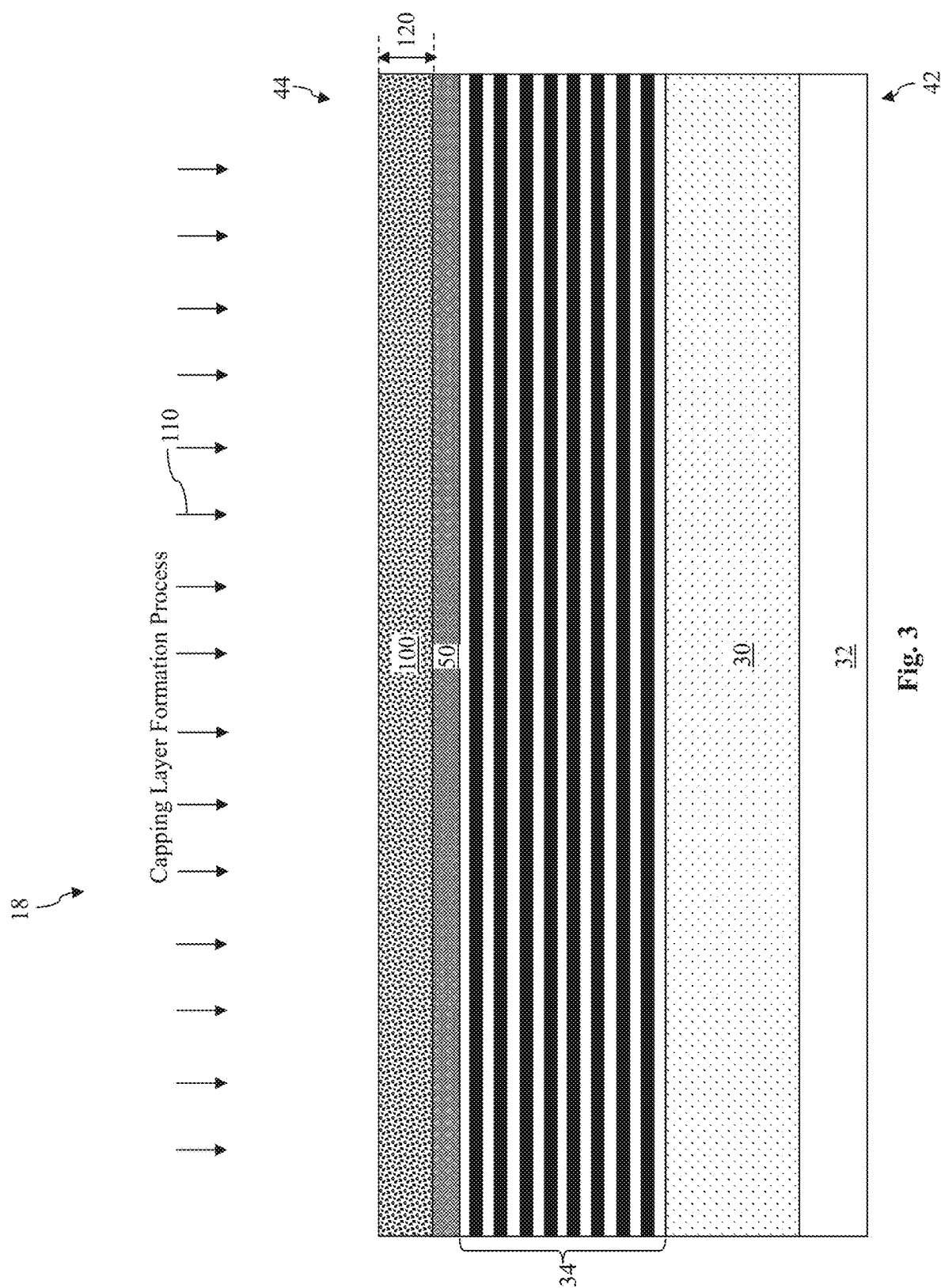

Referring now to FIG. 3, a capping layer 100 is formed over the amorphous layer 50, for example formed directly on the upper surface of the amorphous layer 50. The capping layer 100 may be formed by a capping layer formation process 110. In some embodiments, the capping layer formation process 110 may include an epitaxial growth process, a CVD process (such as APCVD, LPCVD, LECVD, or PECVD), or a PVD process (such as electrically heated evaporation, pulsed laser deposition, electron-beam evaporation, molecular beam epitaxy, ion beam assisted evaporation, sputtering, or arc evaporation).

As discussed above, the presence of the amorphous layer 50 below the capping layer 100 makes it easier for the capping layer 100 to achieve an amorphous structure. In some embodiments, the capping layer 100 includes an amorphous material that contains amorphous ruthenium. In other embodiments, the capping layer 100 includes an amorphous material that contains ruthenium-based compound that is amorphous. For example, the ruthenium-based compound may contain elements such as oxygen (O), niobium (Nb), nitrogen (N), tantalum (Ta), or zirconium (Zr). In some embodiments, the ruthenium-based compound may include: $RuO_2$, RuNb, RuNbO, RuON, RuN, RuNbON, RuTaON, RuZr, or RuZrO. In embodiments where the ruthenium-based compound is RuNb, the atomic weight of the Nb in RuNb is less than or equal to about 50%, for example at about 10%, at about 20%, at about 30%, at about 40%, or at about 50%. In embodiments where the ruthenium-based compound is RuNbO, the atomic weight of the Nb in RuNbO is less than or equal to about 50%, for example at about 10%, at about 20%, at about 30%, at about 40%, or at about 50%.

These ranges of the atomic weight discussed above are specifically tuned to optimize the performance of the capping layer. In that regard, ruthenium is a good candidate for the capping layer because it does not react with hydrogen (which is present in an EUV scanner). However, ruthenium itself may not be quite as etching-resistant as the capping layer 100 should be in order to not become damaged during the various etching processes used to fabricate the EUV lithography mask 18. Niobium is more etching-resistant than ruthenium. As such, adding niobium in a ruthenium-based compound will help increase the etching resistance of the capping layer 100. But if there is too much niobium, such a compound may become more reactive with hydrogen, which is undesirable. Here, the atomic weight of less than 50% for the niobium in the ruthenium-based compound will help the capping layer 100 simultaneously achieve the objective of not reacting with hydrogen that is present in the EUV scanner, as well as having sufficient etching resistance to withstand the various etching processes performed herein.

The capping layer 100 is formed to have a thickness 120. The value of the thickness 120 is tunable by adjusting the various parameters of the capping layer formation process 110, for example a time duration of deposition, etc. In some embodiments, the thickness 120 is tuned to be in a range between about 2.5 nm and about 6 nm, for example between about 2 nm and about 4 nm. Such a thickness range for the capping layer 100 helps ensure that the capping layer 100 is sufficiently thick to adequately protect the multi-layer reflective structure 34 underneath, but not too thick to significantly affect the reflectivity of the multi-layer reflective structure 34.

Figure 4:
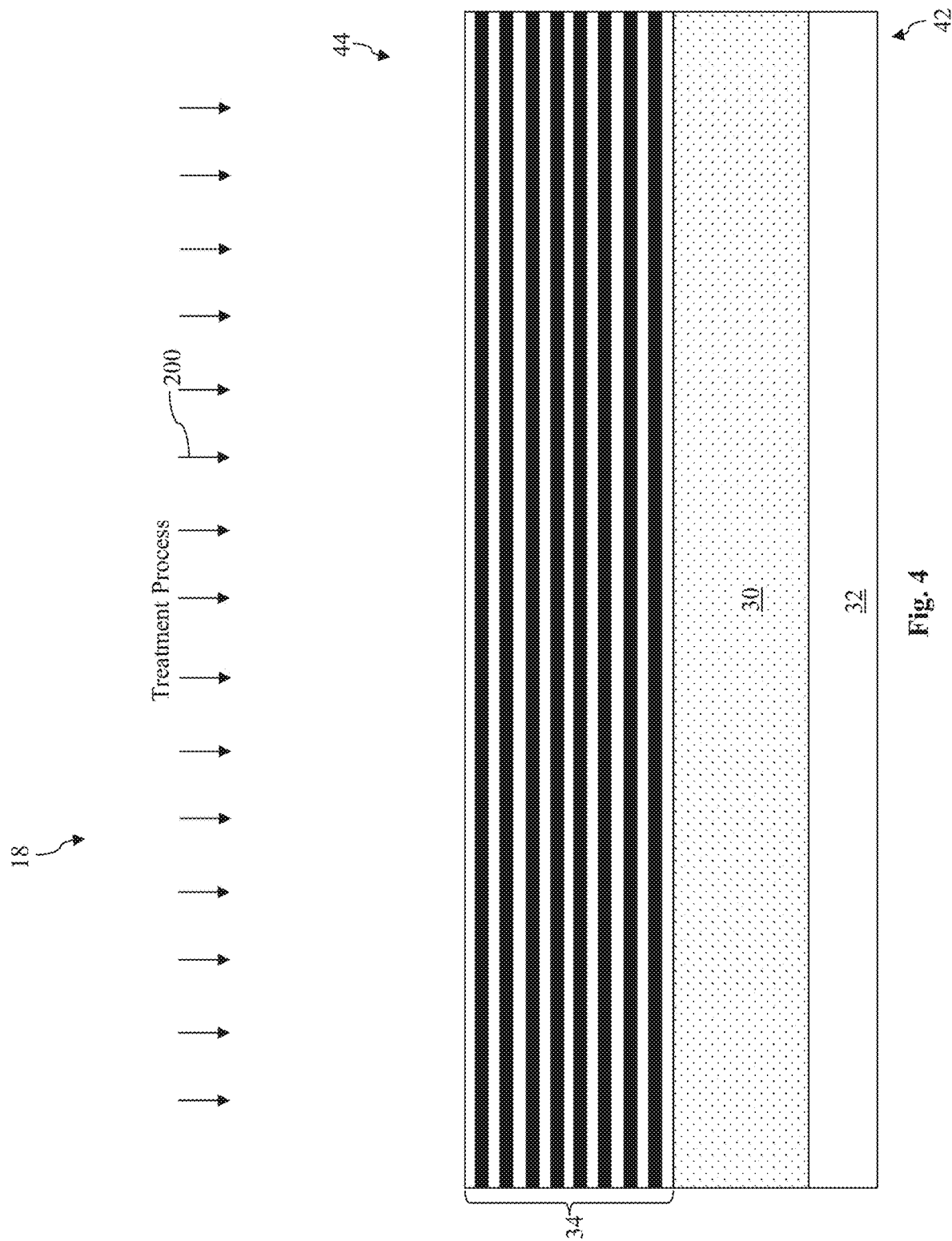
Figure 5:
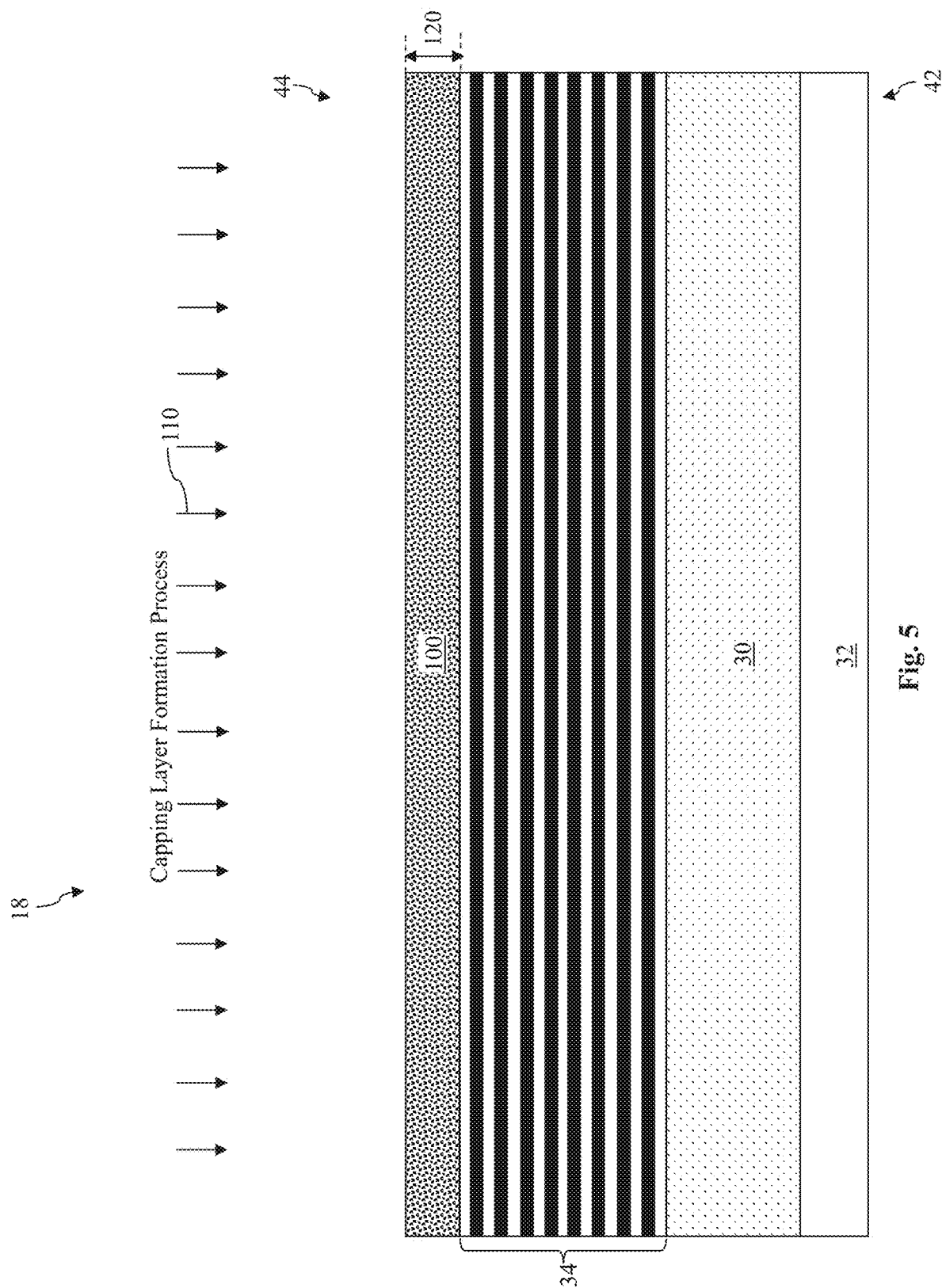
Figure 6:
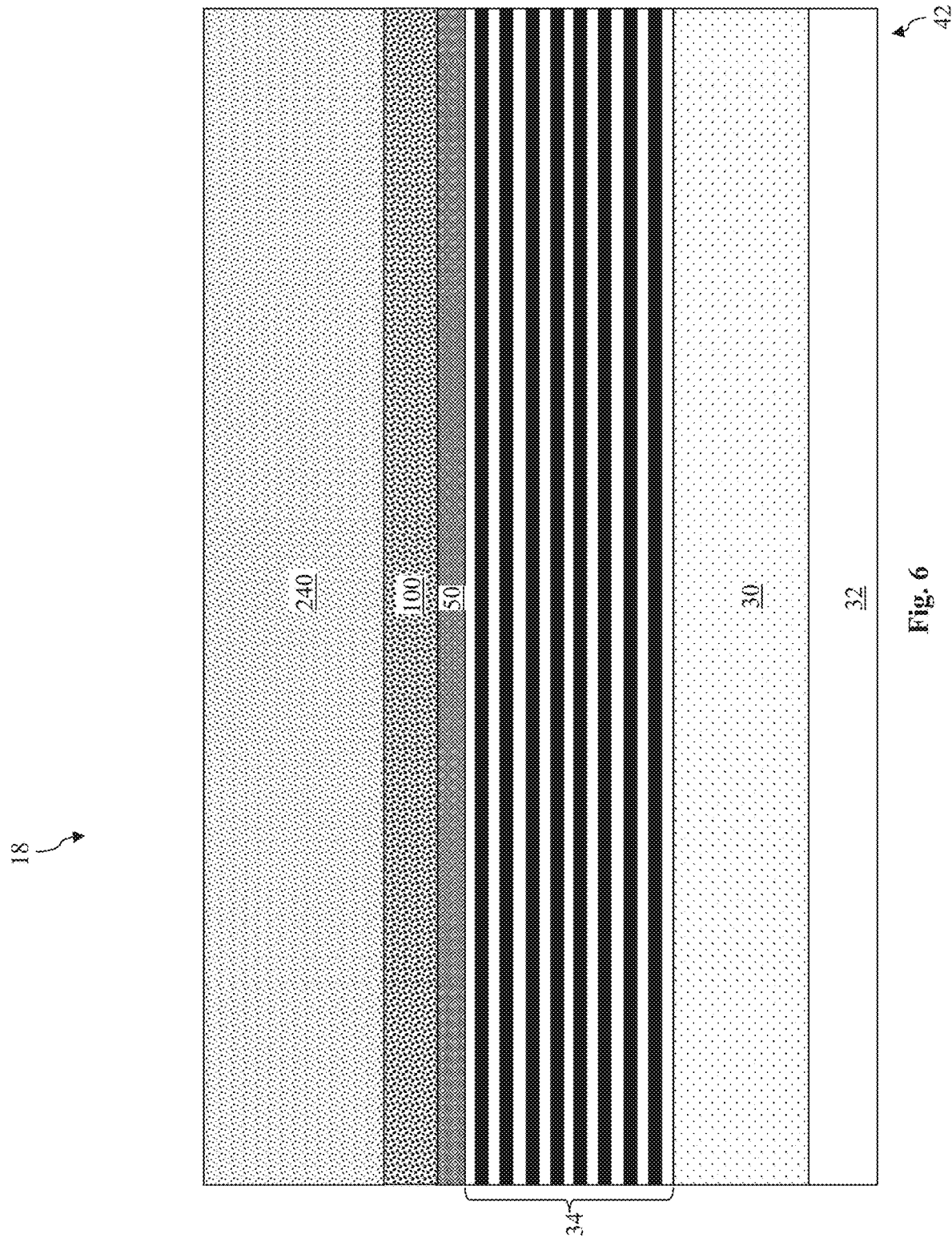

It is understood that FIGS. 2-3 illustrate merely one embodiment of forming an amorphous capping layer 100. Another embodiment of forming the amorphous capping layer 100 is shown in FIGS. 4-5. Referring to FIG. 4, the multi-layer reflective structure 34 is formed over the LTEM substrate 30. A treatment process 200 is performed to treat the upper surface of an uppermost layer (e.g., a silicon layer of the uppermost Si/Mo film pair) of the multi-layer reflective structure 34. The treatment of the uppermost layer of the multi-layer reflective structure 34 facilitates a formation of the amorphous capping layer. In other words, if the uppermost layer of the multi-layer reflective structure 34 had not been treated by the treatment process 200, the capping layer that is to be formed thereon is more likely to have a poly-crystalline structure, which as discussed above is undesirable. Here, the treatment of the uppermost layer of the multi-layer reflective structure 34 means that the capping layer to be formed thereon can achieve an amorphous structure more easily. As discussed above, an amorphous capping layer is desirable because it reduces defects in the EUV mask 18, improves lithography performance, and prolongs the lifespan of the EUV mask 18.

One reason for that the treatment of the multi-layer reflective structure 34 facilitates the formation of an amorphous structure thereon involves free energy. When a film is formed on a substrate, there is a surface free energy of the substrate, and a free energy of the film, and a free energy of an interface between the substrate and the film. A delta free energy may be defined as: the free energy of the film+the free energy of the interface−the surface free energy of the substrate. A delta free energy of less than 0 is associated with a Volmer-Weber mode of film formation, where "islands" appear first, and then these islands coalesce into a continuous film. This is undesirable, as the film formed in this mode is more likely to achieve a poly-crystalline structure and therefore may be prone to damage. On the other hand, a delta free energy of greater than 0 is associated with a Frank-Van der Merwe mode of film formation, where the film is grown layer-by-layer, where each layer mimics the structure of the layer below. This is more desirable, as the layer(s) formed in this manner can achieve the amorphous structure more easily. Here, the treatment process 200 de-wets the uppermost surface of the multi-layer reflective structure 34 and causes the delta free energy to be greater than 0, which facilitates the layer-by-layer amorphous film formation of the capping layer 100.

In some embodiments, the treatment process 200 involves applying plasma to the uppermost layer (e.g., a silicon layer of the Si/Mo film pair) of the multi-layer reflective structure 34. For example, the plasma may include an argon (Ar) plasma, an oxygen ($O_2$) plasma, or a nitrogen ($N_2$) plasma. The plasma treatment of the upper surface of the multi-layer reflective structure 34 removes stains or grease or other contaminants from the upper surface, and therefore improves the uniformity of the upper surface. In some embodiments, the plasma process is performed with a temperature range between about 28 degrees Celsius and about 35 degrees Celsius, and with a time duration range between about 5 seconds and about 60 seconds. Such a temperature range and a time duration range are not randomly chosen but actually specifically configured so as to optimize the effects of the plasma treatment of the uppermost layer of the multi-layer reflective structure 34. For example, if the temperature range and/or the time duration range are too long or too short, that may disrupt the formation of the amorphous capping layer over the treated surface of the multi-layer reflective structure 34.

Referring now to FIG. 5, the capping layer 100 is formed on the uppermost layer of the multi-layer reflective structure 34. Again, the capping layer 100 may be formed using the capping layer formation process 110 discussed above, which may include an epitaxial growth process, a CVD process, or a PVD process. As discussed above, the capping layer 100 has an amorphous structure and may include Ru, $RuO_2$, RuNb, RuNbO, RuON, RuN, RuNbON, RuTaON, RuZr, or RuZrO. Also as discussed above, the process parameters of the capping layer formation process 110 may be configured such that the capping layer 100 has the thickness 120, which may be in a range between about 2.5 nm and about 6 nm.

It is understood that the embodiment discussed above with reference to FIGS. 2-3 and the embodiment discussed above with reference to FIGS. 4-5 may be combined to facilitate the formation of the capping layer 100. For example, in some embodiments, the treatment process 200 may be performed to treat the multi-layer reflective structure 34. Thereafter, the amorphous layer 50 (e.g., an amorphous Si layer, an amorphous SiN layer, or an amorphous $SiO_2$ layer) may be formed on the treated surface of the multi-layer reflective structure 34. The treated surface of the multi-layer reflective structure 34 may also facilitate the formation of the amorphous structure for the amorphous layer 50. Thereafter, the capping layer 100 may be formed on the amorphous layer 50.

Regardless of how the capping layer 100 is formed to achieve an amorphous structure, further fabrication processing may be performed to complete the formation of the EUV mask 18. For example, referring now to FIG. 6, an absorber layer 240 (also referred to as an absorption layer) is formed over the capping layer 100. In some embodiments, the absorber layer 240 absorbs the EUV radiation directed onto the EUV lithography mask 18. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actinium, Radium, Tellurium, Zinc, Copper, Aluminum, nickel, and nickel alloys.

It is understood that in some embodiments, a buffer layer may be optionally formed between the capping layer 100 and the absorber layer 240. The buffer layer may serve as an etching-stop layer in a patterning or repairing process of the absorber layer 240. The buffer layer may have different etching characteristics from the absorber layer disposed thereabove. In some embodiments, the buffer layer may include ruthenium, Ru compounds such as RuB or RuSi, chromium, chromium oxide, or chromium nitride.

Figure 7:
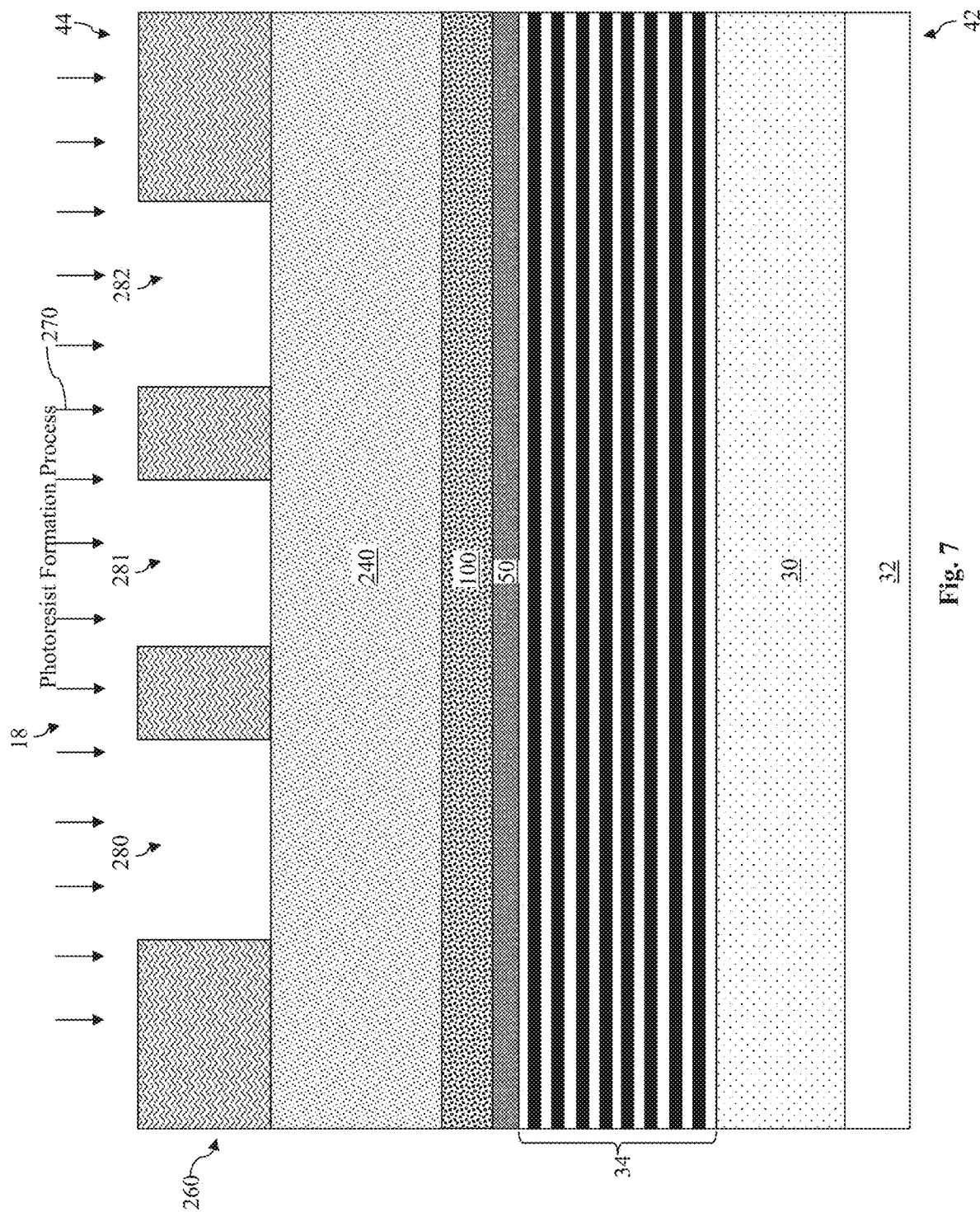

Referring now to FIG. 7, a photoresist layer 260 is formed over the absorber layer 240 from the back side 44 using a photoresist formation process 270. In some embodiments, the photoresist formation process 270 may include a spin-coating process. The photoresist layer 260 may be a EUV photoresist (e.g., sensitive to radiation in the EUV range). The photoresist layer 260 is patterned into a plurality of portions separated by a plurality of openings, for example openings 280, 281, and 282. In some embodiments, the patterning of the photoresist layer 260 may include an electron beam (E-beam) exposure process, a post exposure bake process, and a photoresist developing process.

Figure 8:
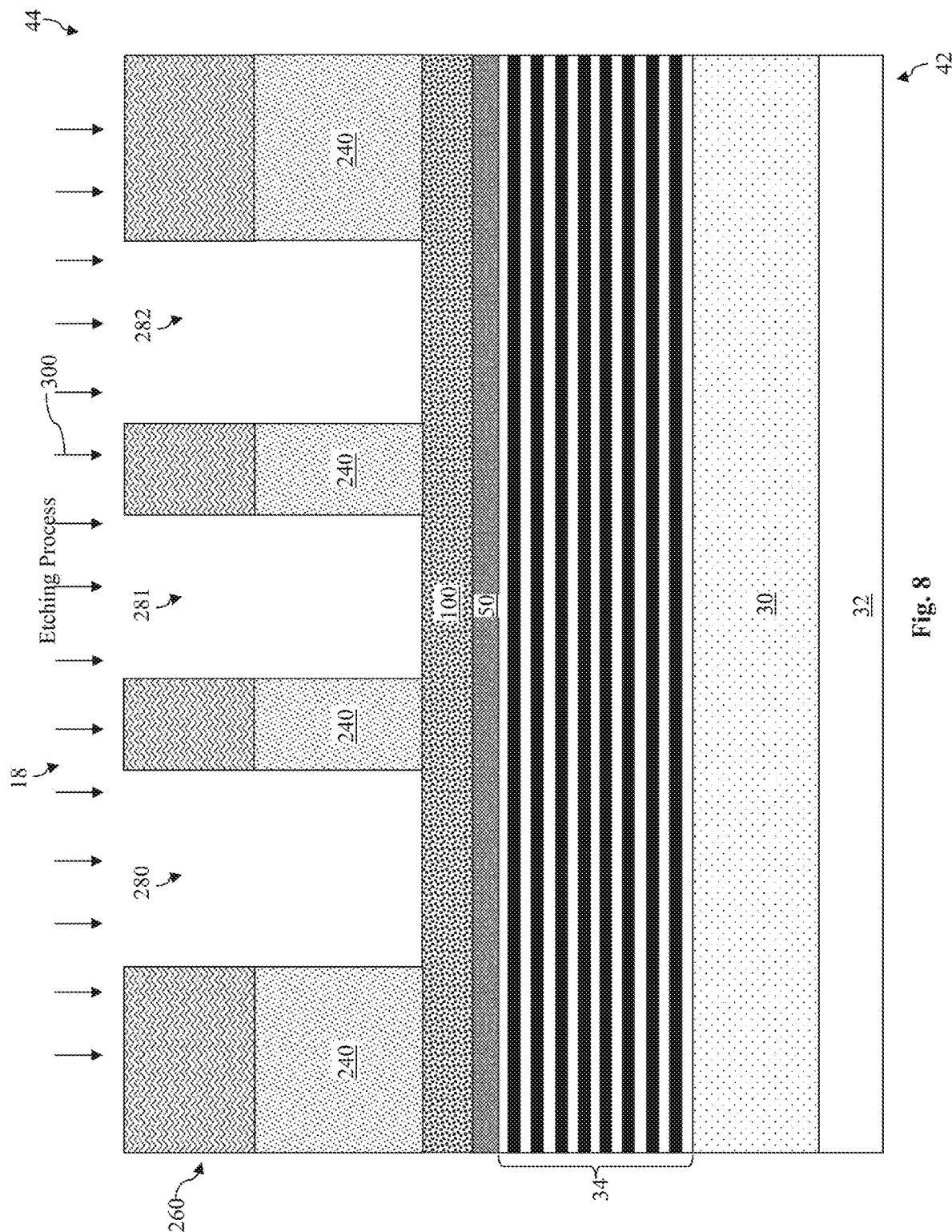

Referring now to FIG. 8, the absorber layer 240 is etched using an etching process 300, with the patterned photoresist layer 260 serving as an etching mask. In other words, the openings 280-282 are vertically extended through the absorber layer 240 until portions of the capping layer 100 are exposed by the openings 280-282. In some embodiments, the etching process 300 may include a dry etching process. The capping layer 100 effectively serves as an etching-stop layer for the etching process 300. For conventional EUV lithography masks where the capping layer has a poly-crystalline structure, the etching process 300 may damage the capping layer due to the poly-crystalline structure having grain boundaries. For example, tiny cracks may appear at the exposed upper surfaces of the poly-crystalline capping layer, or that the exposed portions of the poly-crystalline capping layer may have excessively roughened upper surfaces. These defects may adversely impact the lithography performance and/or shorten the lifespan of the EUV lithography mask. In comparison, the capping layer 100 herein is formed to have an amorphous structure, which allows it to withstand the etching process 300 without incurring significant damages. For example, even after the performance of the etching process 300, the upper surfaces of the exposed portions of the capping layer 100 may be substantially flatter and smoother compared to the poly-crystalline capping layer used for conventional EUV lithography masks.

Figure 9:
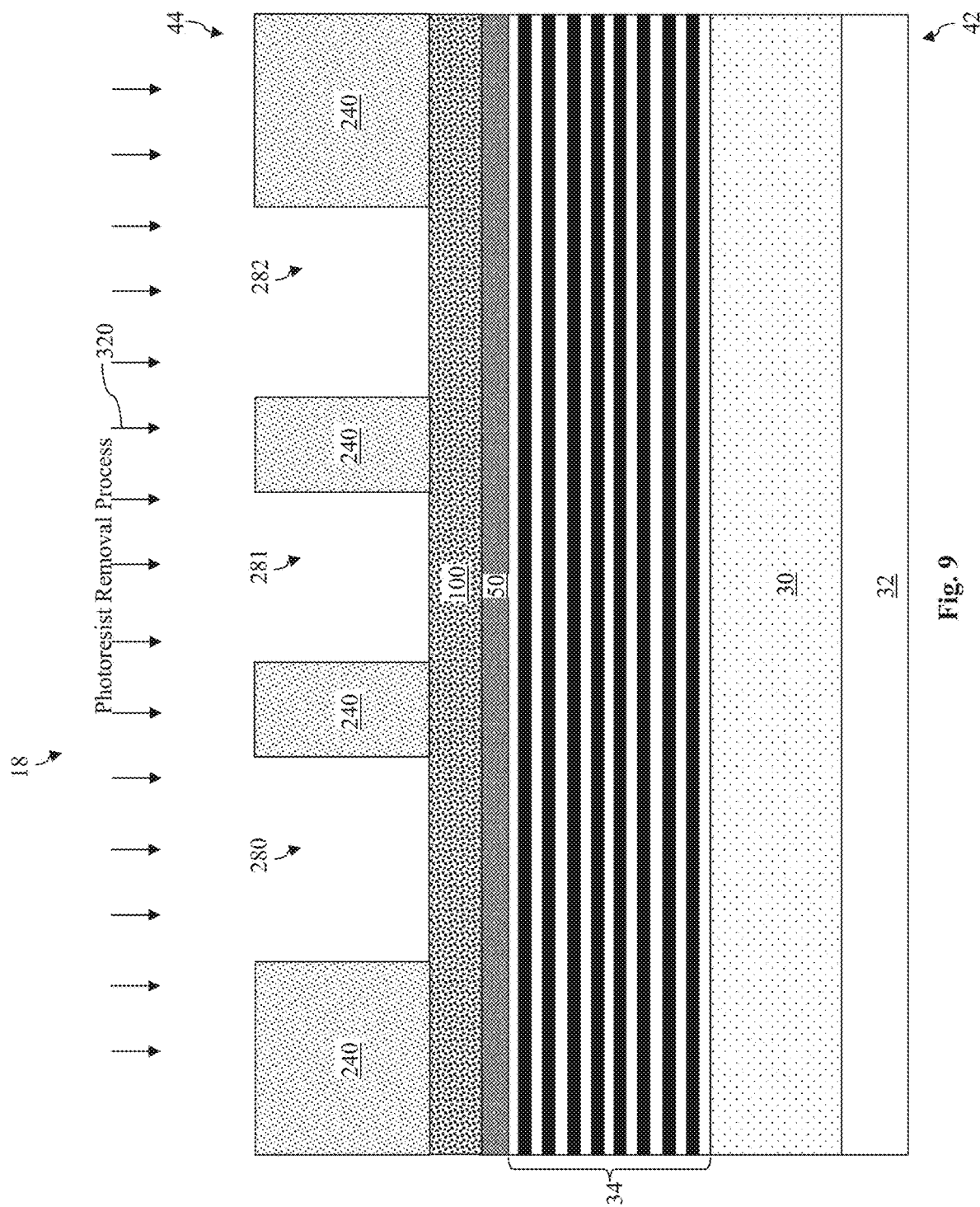

Referring now to FIG. 9, a photoresist removal process 320 is performed to remove the patterned photoresist layer 260. In some embodiments, the photoresist removal process 320 includes a photoresist stripping or ashing process. The photoresist removal process 320 could also damage the poly-crystalline capping layer implemented in conventional EUV lithography masks. However, since the EUV lithography mask 18 herein implements an amorphous capping layer instead, the photoresist removal process 320 may be performed without damaging the capping layer 100 substantially.

Figure 10:
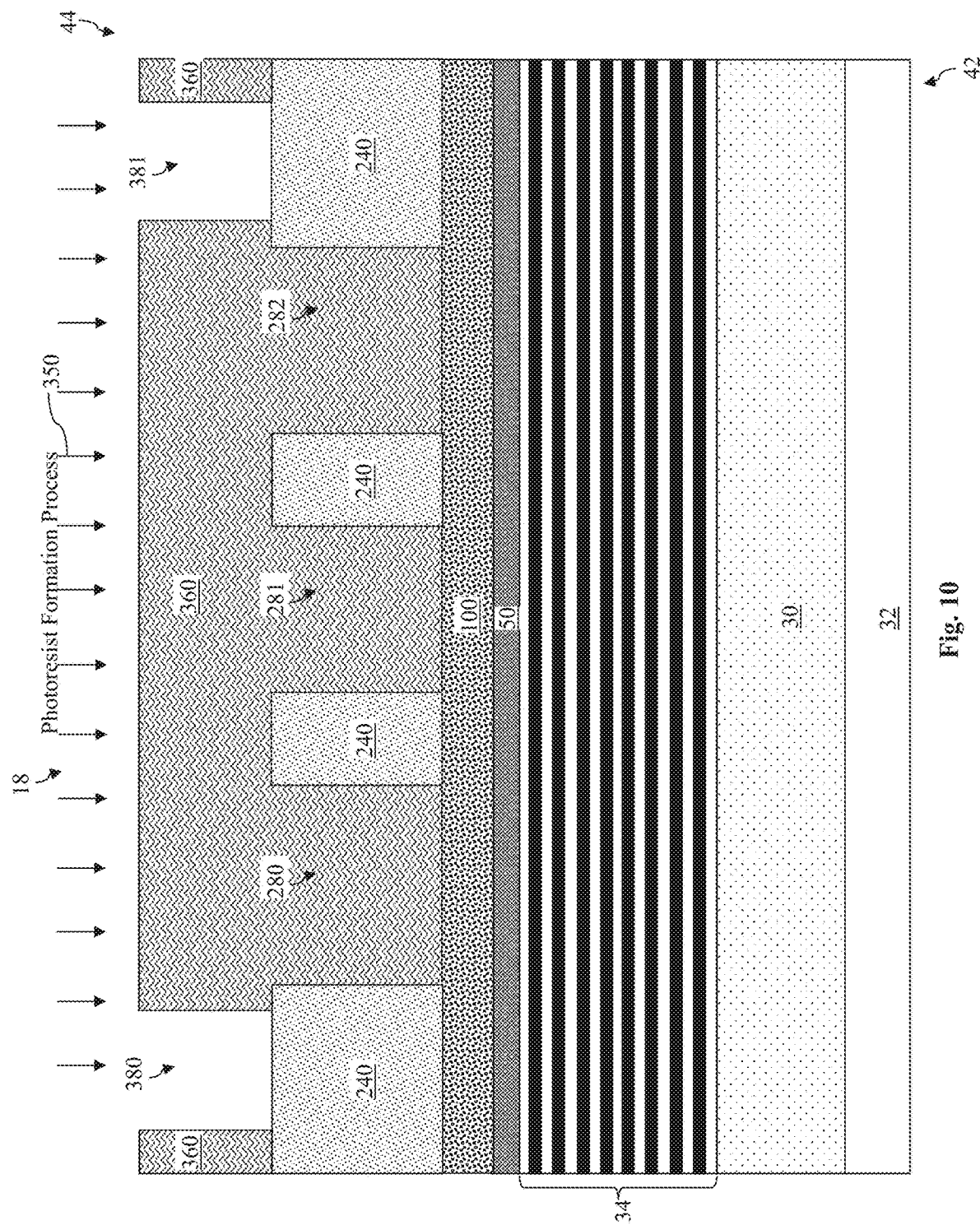

Referring now to FIG. 10, a photoresist formation process 350 is performed to form another patterned photoresist layer 360 over the EUV lithography mask 18. In some embodiments, the photoresist formation process 350 may be include a spin-coating process. The photoresist layer 360 may be a EUV photoresist (e.g., sensitive to radiation in the EUV range). The photoresist layer 360 is patterned into a plurality of portions separated by a plurality of openings, for example openings 380 and 381. The openings 380-381 expose portions of the absorber layer 240. The patterned photoresist layer 360 also fills in the openings 280-282. In some embodiments, the patterning of the photoresist layer 260 may include an electron beam (E-beam) exposure process or laser beam exposure, a post exposure bake process, and a photoresist developing process.

Figure 11:
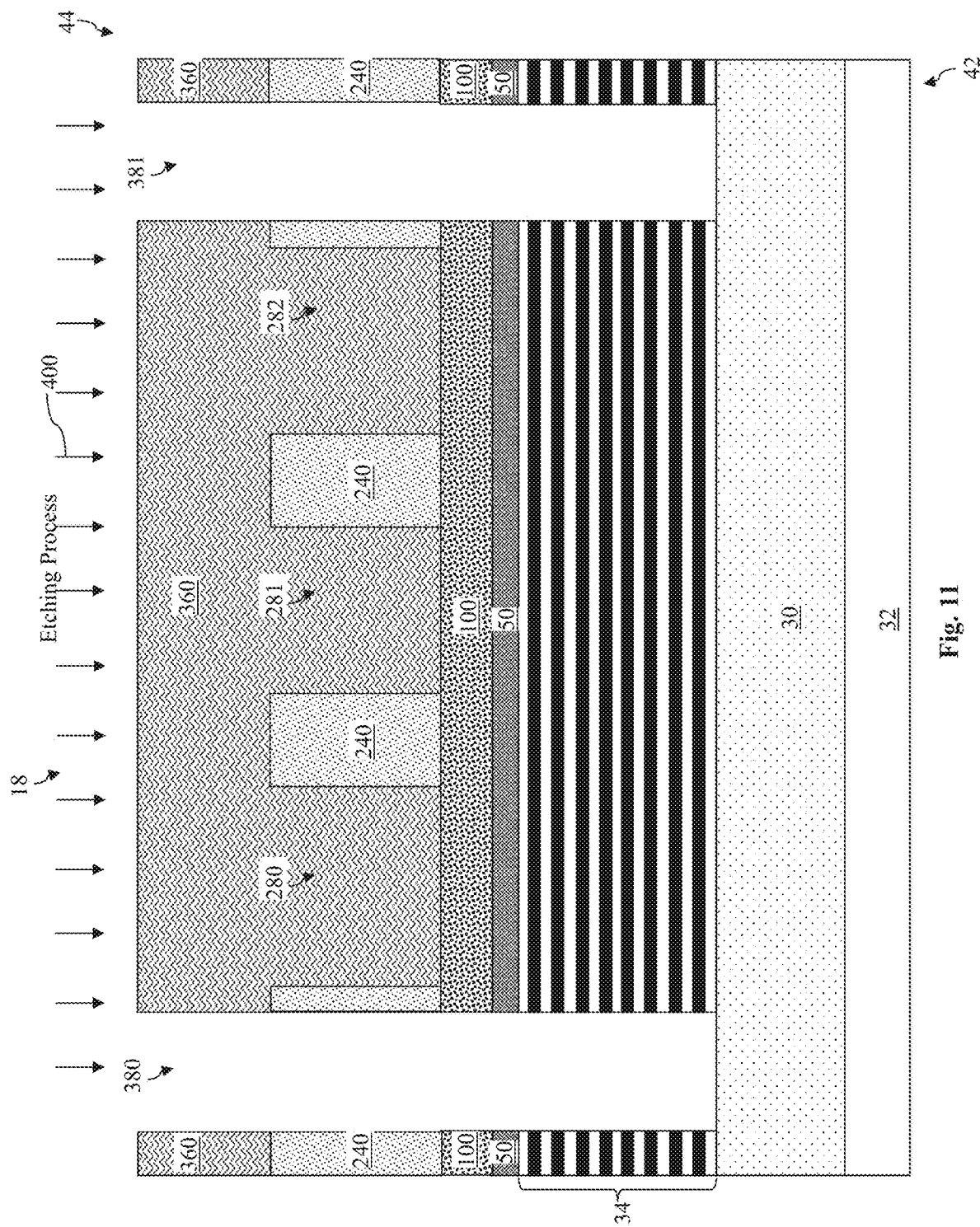

Referring now to FIG. 11, an etching process 400 is performed to the EUV lithography mask 18 from the side 44. The patterned photoresist layer 360 serves as a protecting layer during the etching process 400, so as to protect the layers located therebelow from being etched. Meanwhile, the etching process 400 etches away portions of the absorber layer 240, the capping layer 100, the amorphous layer 50 (in embodiments where the amorphous layer 50 is formed), and the multi-layer reflective structure 34. As a result, the openings 380-381 are extended downwardly (from the side 44 toward the side 42) and through the absorber layer 240, the capping layer 100, the amorphous layer 50, and the multi-layer reflective structure 34. The etching process 400 stops when the LTEM substrate 30 is reached, and thus portions of the LTEM substrate 30 are exposed by the openings 380-381.

Figure 12:
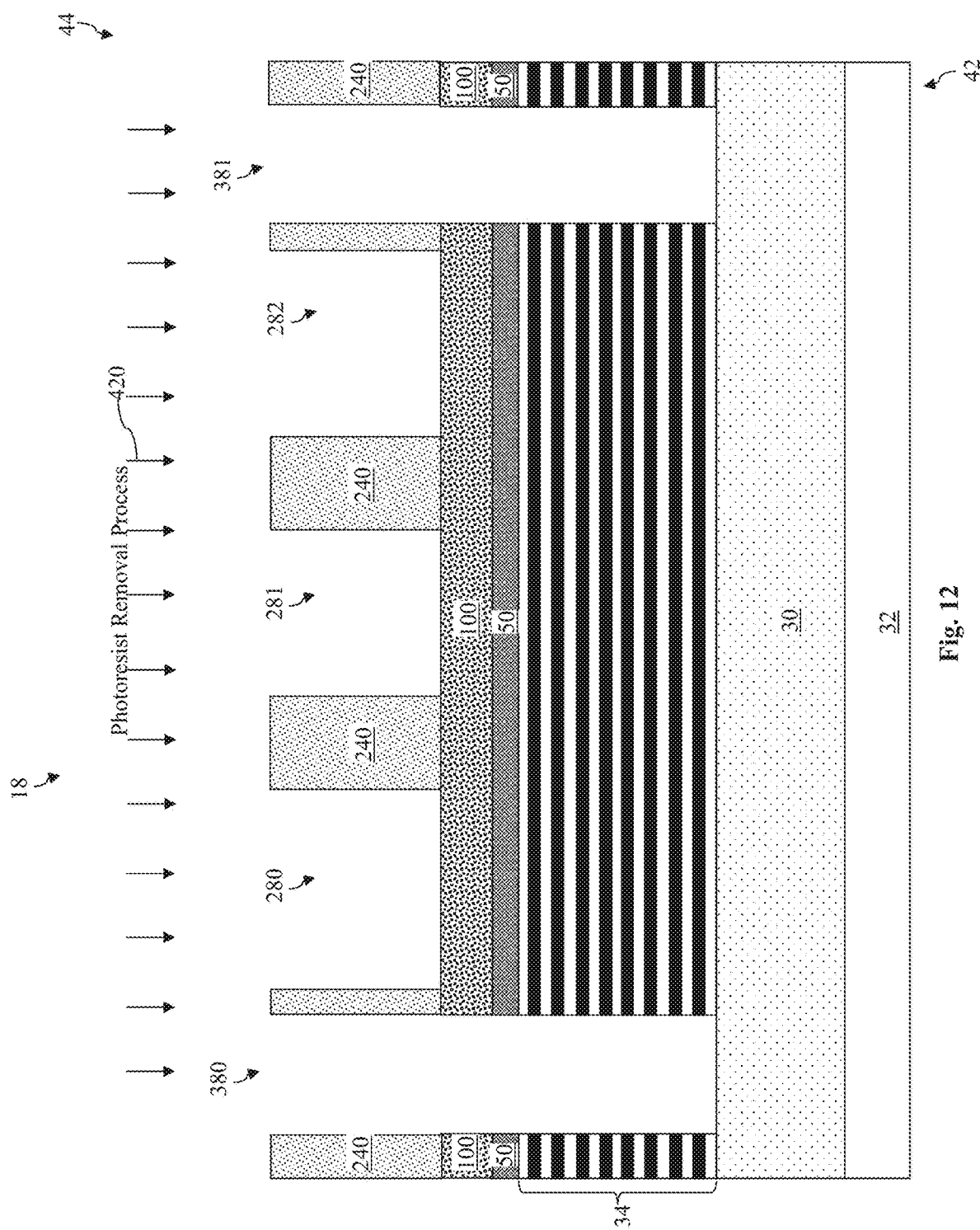

Referring now to FIG. 12, a photoresist removal process 420 is performed to remove the patterned photoresist layer 360. In some embodiments, the photoresist removal process 420 includes a photoresist stripping or ashing process. The photoresist removal process 420 could further damage the poly-crystalline capping layer implemented in conventional EUV lithography masks. However, since the EUV lithography mask 18 herein implements an amorphous capping layer instead, the photoresist removal process 420 may be performed without damaging the capping layer 100 substantially.

After the photoresist removal process 420 has been performed, one or more cleaning processes may also be performed to clean the EUV lithography mask 18, for example to remove contaminant particles disposed on the EUV lithography mask 18. Since portions of the capping layer 100 are still exposed by the openings 280-282, the chemicals (e.g., solution that contain oxygen and/or hydrogen) used in the one or more cleaning processes would seeped into the cracked or roughened surfaces of the capping layer and therefore further damage the capping layer if the capping layer had been implemented using a poly-crystalline material. However, since the capping layer 100 herein is implemented using an amorphous material, the cleaning processes will not cause damage to the capping layer 100 according to embodiments of the present disclosure.

Figure 13:
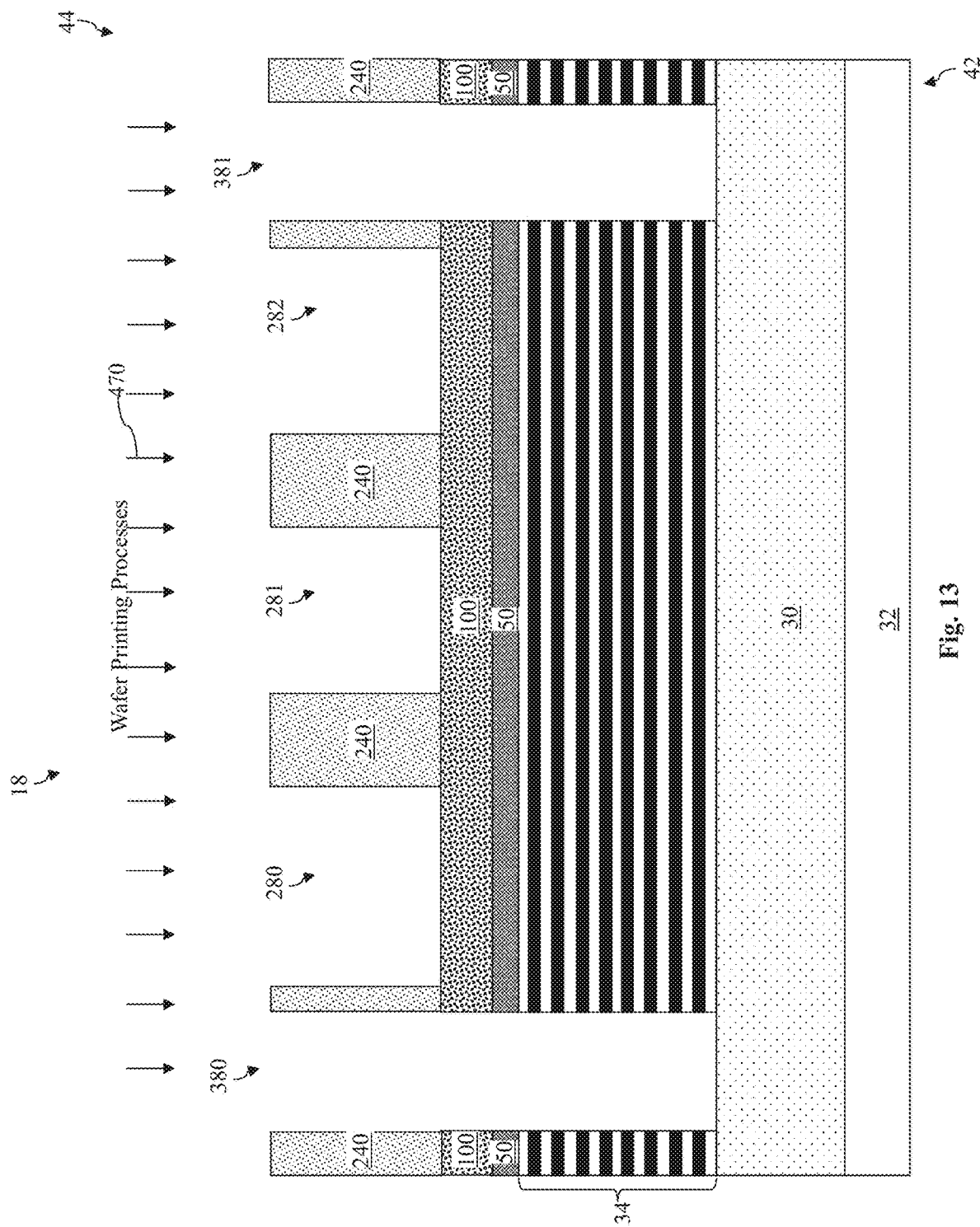

Referring now to FIG. 13, one or more wafer printing processes 470 may be performed using the EUV lithography mask 18. In other words, the EUV lithography mask 18 may be used as a lithography mask in one or more EUV lithography processes to define or pattern various features on a semiconductor wafer. The wafer printing processes 470 may generate outgassing products, for example outgassing products that contain carbon, hydrogen, oxygen, etc. These outgassing products may come into contact with various components of the EUV lithography mask 18, including the exposed surfaces of the capping layer 100. Had the capping layer 100 been implemented using a poly-crystalline material (e.g., in conventional EUV lithography masks), such exposed surfaces may have already suffered extensive damage (e.g., excessive roughness or cracks) by the time the wafer printing processes 470 are performed. It would have been easier for the outgassing products to stick onto the exposed (and damaged) surfaces of the capping layer, since the roughened surfaces of such a capping layer could trap the outgassing products. The presence of the outgassing products on the damaged capping layer surfaces contaminate the EUV lithography mask and would have further deteriorated the performance of the lithography process. For example, the reflectivity of the multi-layer reflective structure 34 would have been undesirably altered due to the outgassing products stuck on the capping layer surfaces. Again, the EUV lithography mask 18 of the present disclosure does not suffer from this problem, since the amorphous capping layer 100 is substantially free of damage, and therefore the outgassing products generated by the wafer printing processes 470 will not become stuck on the exposed surfaces of the capping layer 100. Consequently, the present disclosure avoids the undesirable contamination of the EUV lithography mask 18.

Figure 14:
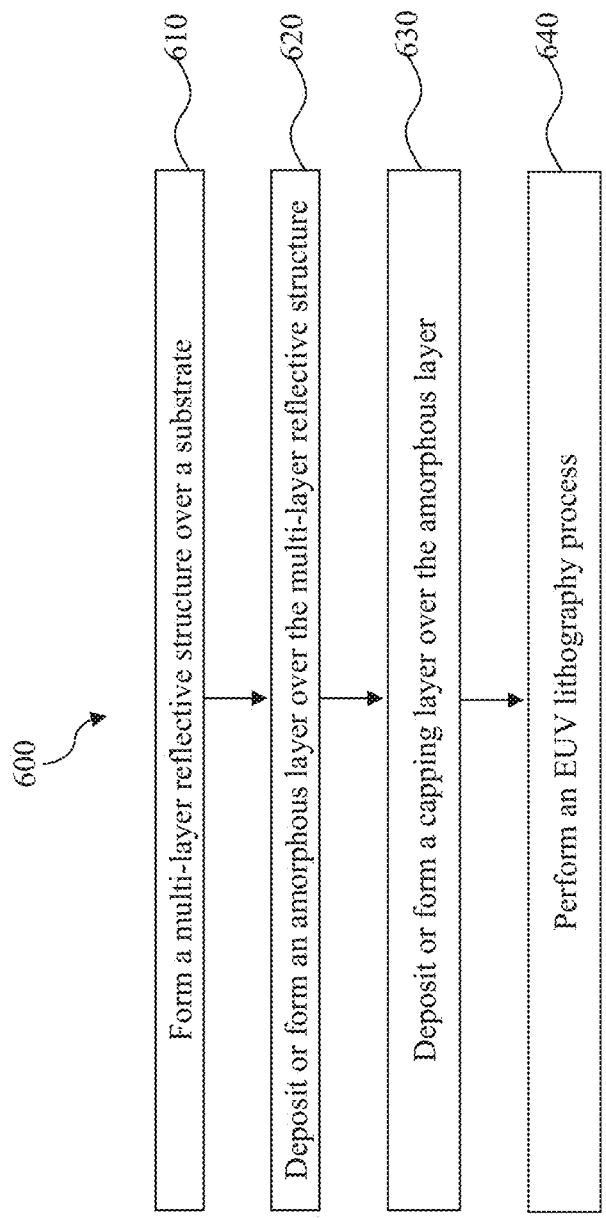
FIG. 14 is a flowchart illustrating a method of fabricating and using a lithography mask in accordance with some embodiments of the present disclosure.

FIG. 14 is a flowchart of a method 600 of performing a semiconductor fabrication process according to various aspects of the present disclosure.

The method 600 includes a step 610 of forming a multi-layer reflective structure over a substrate. In some embodiments, the reflective structure includes a multilayer structure that is configured to provide a high reflectivity for a predefined radiation wavelength, for example a reflectivity above a predetermined threshold.

The method 600 includes a step 620 of depositing or growing an amorphous layer over the multi-layer reflective structure. In some embodiments, the depositing or growing the amorphous layer comprises depositing or growing an amorphous silicon layer, an amorphous silicon oxide layer, or an amorphous silicon nitride layer.

The method 600 includes a step 630 of depositing or growing a capping layer over the amorphous layer. In some embodiments, the depositing or growing the capping layer comprises depositing or growing an amorphous material that contains ruthenium as the capping layer. The amorphous material may further contain: oxygen, niobium, nitrogen, tantalum, or zirconium.

The method 600 includes a step 640 of performing an EUV lithography process. For example, the substrate, the multi-layer reflective structure, the amorphous layer, and the capping layer may be parts of an extreme ultraviolet (EUV) lithography mask. The EUV lithography process may be performed using the EUV lithography mask.

It is understood that additional processes may be performed before, during, or after the steps 610-640 of the method 600 to complete the fabrication of the lithography mask. For example, before the depositing or growing the amorphous layer, the method 600 may include a step of performing a plasma treatment process on the multi-layer reflective structure. In some embodiments, the plasma treatment process comprises applying Ar plasma, O2 plasma, or N2 plasma to the multi-layer reflective structure. For reasons of simplicity, additional steps are not discussed herein in detail.

Figure 15:
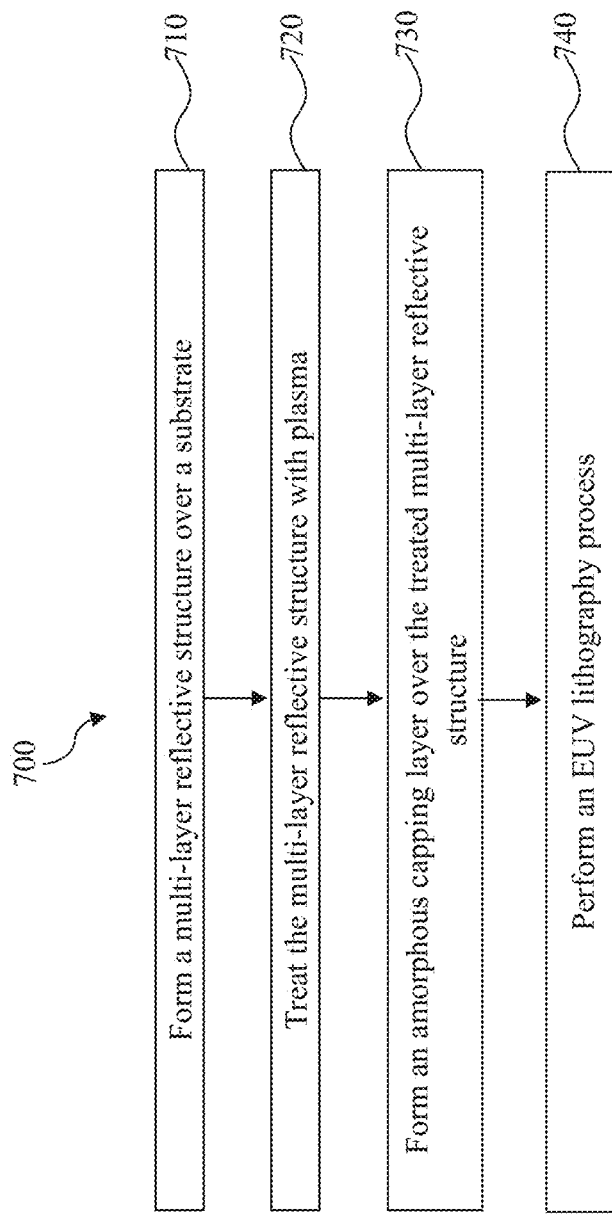
FIG. 15 is a flowchart illustrating a method of fabricating and using a lithography mask in accordance with some embodiments of the present disclosure.

FIG. 15 is a flowchart of a method 700 of performing a semiconductor fabrication process according to various aspects of the present disclosure.

The method 700 includes a step 710 of forming a multi-layer reflective structure over a substrate. In some embodiments, the reflective structure includes a multilayer structure that is configured to provide a high reflectivity for a pre-defined radiation wavelength, for example a reflectivity above a predetermined threshold.

The method 700 includes a step 720 of treating the multi-layer reflective structure with plasma. In some embodiments, the step 720 comprises treating the multi-layer reflective structure with Ar plasma, O2 plasma, or N2 plasma.

The method 700 includes a step 730 of forming an amorphous capping layer over the multi-layer reflective structure. The step 730 may be performed after the multi-layer reflective structure has been treated.

The method 700 includes a step 740 of performing an EUV lithography process. For example, the substrate, the multi-layer reflective structure, the capping layer may be parts of an extreme ultraviolet (EUV) lithography mask. The EUV lithography process may be performed using the EUV lithography mask.

It is understood that additional processes may be performed before, during, or after the steps 710-740 of the method 700 to complete the fabrication of the lithography mask. For example, after the treating of the step 720 but before the forming the amorphous capping layer of the step 730, the method 700 may include a step of forming a first layer over the multi-layer reflective structure. The amorphous capping layer is formed over the first layer. In some embodiments, the first layer is formed to have a different type of amorphous material than the amorphous capping layer. For reasons of simplicity, additional steps are not discussed herein in detail.

In summary, the present disclosure forms an amorphous capping layer for an EUV lithography mask. The amorphous capping layer may be formed by substrate tuning, which may involve forming a thin amorphous layer on a multi-layer reflective structure first, and then forming the amorphous capping layer on that thin amorphous layer using an epitaxial process or a CVD or PVD process. The amorphous capping layer may also be formed by treating the multi-layer reflective structure, and then forming the amorphous capping layer on the treated surface of the multi-layer reflective structure using an epitaxial process or a CVD or PVD process.

Based on the above discussions, it can be seen that the EUV mask of the present disclosure offers advantages over conventional EUV masks. It is understood, however, that other embodiments may offer additional advantages, and not all advantages are necessarily disclosed herein, and that no particular advantage is required for all embodiments. One advantage is that the EUV lithography mask of the present disclosure can achieve better film quality for the capping layer compared to conventional EUV lithography masks. As discussed above, conventional EUV lithography masks form a poly-crystalline capping layer, whose grain boundaries are prone to damage as a result of various etching and/or cleaning processes being performed. The damaged poly-crystalline capping layer may lead to degraded lithography performance (e.g., worse critical dimensions). In comparison, the EUV lithography mask herein forms an amorphous capping layer, which can withstand the damaging effects of the various etching and/or cleaning processes much better than the poly-crystalline capping layer. Therefore, the amorphous capping layer has improved film quality, and thus the EUV lithography mask herein has improved lithography performance compared to conventional EUV lithography masks.

In addition, as EUV lithography masks are used in wafer printing, outgassing products may be generated. These outgassing products are more easily adhere onto the exposed surfaces of the damaged poly-crystalline capping layer of conventional EUV lithography masks, which could degrade lithography performance. Here, since the amorphous capping layer is substantially free of having damaged surfaces, the outgassing products are less likely to be stuck on the EUV lithography mask of the present disclosure. Consequently, lithography performance is improved.

Furthermore, the damaged poly-crystalline capping layer of conventional EUV lithography masks may cause the conventional EUV mask to fail more quickly, or at least lead to a deterioration of the EUV lithography mask to a point where it no longer has a satisfactory performance and should be replaced. Stated differently, the poly-crystalline capping layer's propensity to being damaged may shorten the lifespan of the conventional EUV lithography mask. In comparison, the amorphous capping layer herein can substantially lengthen the lifespan of the EUV lithography mask. Since it may be costly to replace or repair EUV lithography masks, the present disclosure can substantially reduce the cost of fabrication.

One aspect of the present disclosure pertains to an apparatus. The apparatus includes a substrate. The apparatus includes a multi-layer reflective structure disposed over the substrate. The apparatus includes an amorphous capping layer disposed over the multi-layer reflective structure.

Another aspect of the present disclosure pertains to a method. The method includes forming a multi-layer reflective structure over a substrate. The method includes depositing or growing an amorphous layer over the multi-layer reflective structure. The method includes depositing or growing a capping layer over the amorphous layer.

Yet another aspect of the present disclosure pertains to a method. The method includes forming a multi-layer reflective structure over a substrate. The method includes treating the multi-layer reflective structure with plasma. The method includes: after the treating, forming an amorphous capping layer over the multi-layer reflective structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus, comprising:
   a substrate;
   a multi-layer reflective structure disposed over the substrate; and an amorphous capping layer disposed over the multi-layer reflective structure.

2. The apparatus of claim 1, wherein the amorphous capping layer contains ruthenium.

3. The apparatus of claim 2, wherein the amorphous capping layer further contains: oxygen, niobium, nitrogen, tantalum, or zirconium.

4. The apparatus of claim 2, wherein the amorphous capping layer includes Ru, $RuO_2$, RuNb, RuNbO, RuON, RuN, RuNbON, RuTaON, RuZr, or RuZrO.

5. The apparatus of claim 4, wherein the amorphous capping layer includes:
RuNb in which wherein an atomic weight of the Nb is less than 50%; or
RuNbO in which wherein an atomic weight of the Nb is less than 50%.

6. The apparatus of claim 1, further comprises: an amorphous layer disposed between the multi-layer reflective structure and the amorphous capping layer.

7. The apparatus of claim 6, wherein the amorphous layer includes amorphous silicon, amorphous silicon oxide, or amorphous silicon nitride.

8. The apparatus of claim 1, wherein the multi-layer reflective structure includes a plurality of pairs of silicon and molybdenum films.

9. The apparatus of claim 1, wherein the apparatus is an extreme ultraviolet (EUV) lithography mask.

10. A method, comprising:
forming a multi-layer reflective structure over a substrate;
depositing or growing an amorphous layer over the multi-layer reflective structure; and
depositing or growing a capping layer over the amorphous layer.

11. The method of claim 10, wherein the substrate, the multi-layer reflective structure, the amorphous layer, and the capping layer are parts of an extreme ultraviolet (EUV) lithography mask, and wherein the method further comprises: providing the EUV lithography mask to an entity that performs an EUV lithography process.

12. The method of claim 10, wherein the depositing or growing the amorphous layer comprises depositing or growing an amorphous silicon layer, an amorphous silicon oxide layer, or an amorphous silicon nitride layer.

13. The method of claim 10, wherein the depositing or growing the capping layer comprises depositing or growing an amorphous material that contains ruthenium as the capping layer.

14. The method of claim 13, wherein the amorphous material further contains: oxygen, niobium, nitrogen, tantalum, or zirconium.

15. The method of claim 10, further comprising: before the depositing or growing the amorphous layer, performing a plasma treatment process on the multi-layer reflective structure.

16. The method of claim 15, wherein the plasma treatment process comprises applying Ar plasma, $O_2$ plasma, or $N_2$ plasma.

17. A method, comprising:
forming a multi-layer reflective structure over a substrate;
treating the multi-layer reflective structure with plasma; and
after the treating, forming an amorphous capping layer over the multi-layer reflective structure.

18. The method of claim 17, further comprising: after the treating but before the forming the amorphous capping layer, forming a first layer over the multi-layer reflective structure, wherein the amorphous capping layer is formed over the first layer.

19. The method of claim 18, wherein the first layer is formed to have a different type of amorphous layer than the amorphous capping layer.

20. The method of claim 17, wherein the treating comprises treating the multi-layer reflective structure with Ar plasma, $O_2$ plasma, or $N_2$ plasma.

* * * * *